(12) United States Patent
Griswold et al.

(10) Patent No.: US 6,505,149 B1
(45) Date of Patent: Jan. 7, 2003

(54) METHOD AND SYSTEM FOR VERIFYING A SOURCE-SYNCHRONOUS COMMUNICATION INTERFACE OF A DEVICE

(75) Inventors: Mark Griswold, Portland, OR (US); Jen-Tien Yen, Austin, TX (US)

(73) Assignees: International Business Machines Corporation, Armonk, NY (US); Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/365,387

(22) Filed: Aug. 2, 1999

(51) Int. Cl.[7] ............................................. G06F 17/50
(52) U.S. Cl. ............................ 703/14; 703/13; 703/19; 716/6
(58) Field of Search ................................. 703/14, 19, 21

(56) References Cited

U.S. PATENT DOCUMENTS

| | | | |
|---|---|---|---|
| 4,744,084 A | | 5/1988 | Beck et al. |
| 4,860,285 A | | 8/1989 | Miller et al. |
| 4,882,739 A | * | 11/1989 | Potash et al. ............... 375/358 |
| 4,893,318 A | * | 1/1990 | Potash et al. ............... 375/358 |
| 4,924,430 A | * | 5/1990 | Zasio et al. ...................... 716/6 |
| 5,341,396 A | | 8/1994 | Higgins et al. |
| 5,461,575 A | * | 10/1995 | Schucker et al. ............. 703/14 |
| 5,544,342 A | * | 8/1996 | Dean .......................... 711/119 |
| 5,666,480 A | * | 9/1997 | Leung et al. ................... 714/1 |
| 5,794,020 A | * | 8/1998 | Tanaka et al. ............... 713/401 |
| 6,016,066 A | * | 6/2000 | Iikbahar ....................... 327/23 |
| 6,324,485 B1 | * | 11/2001 | Ellis ............................ 702/117 |

OTHER PUBLICATIONS

Arabi et al. "Modeling simulation and design methodology of the interconnect and package of an ultra–high speed source synchronous bus", IEEE Topical meeting on Electrical Performance of Electronic packaging, 1998.*

* cited by examiner

Primary Examiner—Samuel Broda
Assistant Examiner—Kandasamy Thangavelu
(74) Attorney, Agent, or Firm—Anthony V. S. England; Robert M. Carwell; Bracewell & Patterson, L.L.P.

(57) ABSTRACT

A method for verifying a source-synchronous communication interface of a processor is disclosed. A software model of a first device having a source-synchronous communication interface and a software model of a second device capable of communicating with the first device via the source-synchronous communication interface are provided. The source-synchronous communication interface includes an applied clock line, an address line, an echo clock line, and a data line. A simulation of a data request from the first device model to the second device model via an applied clock signal along with an address on the applied clock line and the address line is initially performed. The requested data is then received by the first device model from the second device model via the data line after various delays between the applied clock signal and an echo clock signal on the applied clock line and the echo clock line, respectively. Finally, the requested data received by the first device model is verified as to its veracity.

12 Claims, 6 Drawing Sheets

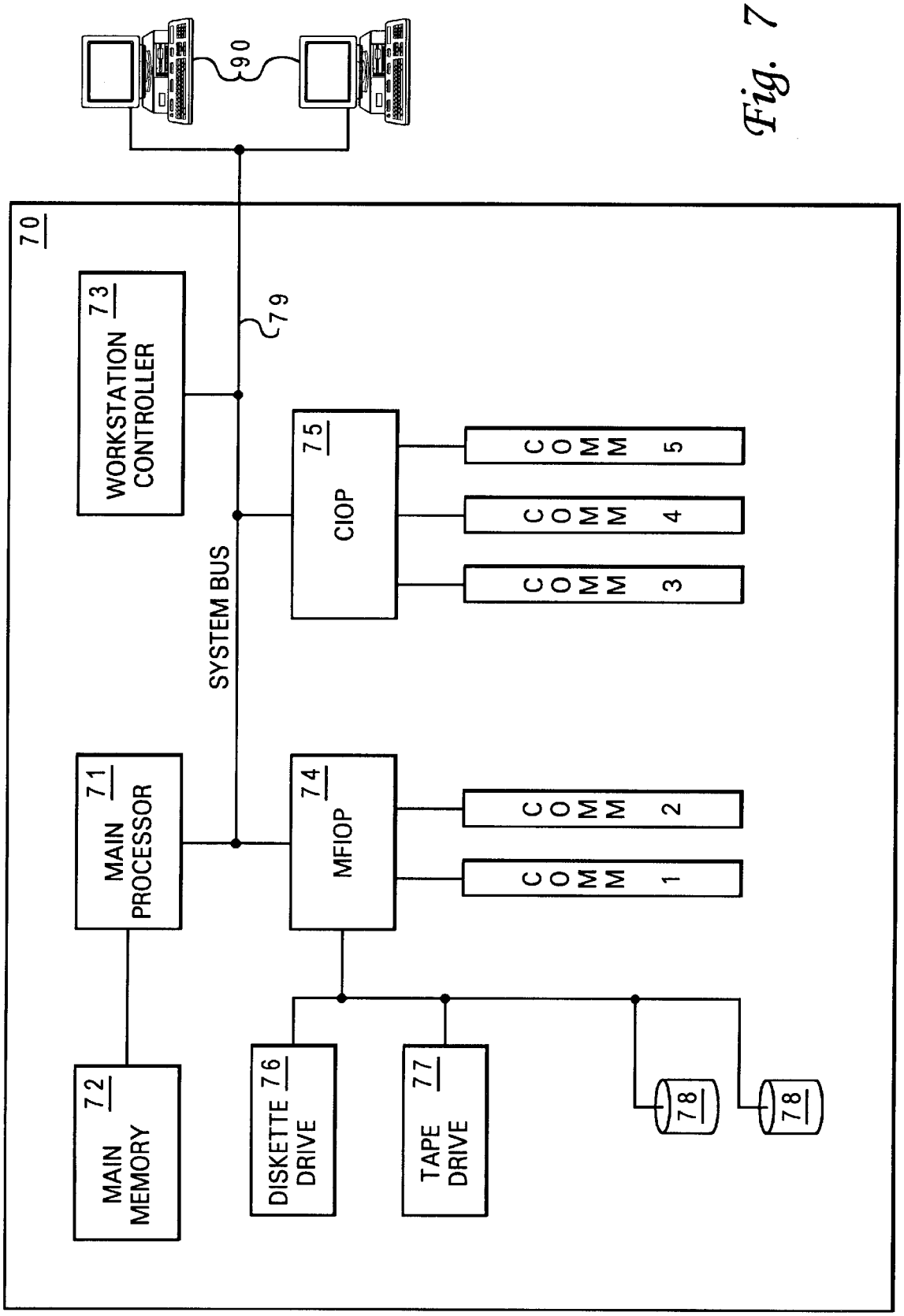

METHOD AND SYSTEM FOR VERIFYING A SOURCE-SYNCHRONOUS COMMUNICATION INTERFACE OF A DEVICE

BACKGROUND OF THE INVENTION

1. Technical Field

The present invention relates to a method and system for performing simulation in general, and in particular to a method and system for performing system verification of a device. Still more particularly, the present invention relates to a method and system for verifying a source-synchronous communication interface of a device.

2. Description of the Prior Art

Traditionally, a computer system contains various components that are interconnected with each other via pins and system traces. These components, such as processors, controllers, memories, etc., typically utilize fully-synchronous communication in which the same clock signal is used to drive and to receive interface signals. However, the speed of synchronous communication becomes a bottleneck as interface operation frequency begins to increase. One solution to the communication speed problem is to utilize source-synchronous communication in which different clocks are used to drive and to receive interface signals.

With source-synchronous communication, a sending component sends a sample clock signal along with the group of data signals being transferred, and the sample clock signal is then used by the receiving component to sample the group of data signals. After sampling, the sampled signals must subsequently be transferred to the local clock domain of the receiving component. It has been observed that clock domain transfer problems often arise in logic circuit interfaces that are specifically designed for time critical source-synchronous communication. Therefore, a need exists for testing various aspects of source-synchronous communication during the design phase in order to verify proper logic implementation of those logic circuit interfaces. The present disclosure provides a method and system for verifying the proper functionality of a source-synchronous communication interface of a device, such as a processor.

SUMMARY OF THE INVENTION

In accordance with a preferred embodiment of the present invention, a software model of a first device having a source-synchronous communication interface and a software model of a second device capable of communicating with the first device via the source-synchronous communication interface are provided. The source-synchronous communication interface includes an applied clock line, an address line, an echo clock line, and a data line. A simulation of a data request from the first device model to the second device model via an applied clock signal along with an address on the applied clock line and the address line is initially performed. The requested data is then received by the first device model from the second device model via the data line after various delays between the applied clock signal and an echo clock signal on the applied clock line and the echo clock line, respectively. Finally, the requested data received by the first device model is verified as to its veracity.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 7 is a block diagram of a computer system that may be utilized by a preferred embodiment of the invention.

DETAILED DESCRIPTION OF A PREFERRED EMBODIMENT

Typically, when performing a software simulation on a fully-synchronous communication interface under design, various delays and skews between a master (or requesting) component and a slave (or responding) component are encapsulated in a set of circuit simulation modules, and thus there is no effect on the logic design of the master component. However, with a source-synchronous communication interface, several system-dependent factors can affect the delay between a request from a master component and a corresponding response returned from a slave component, which directly affects the logic design of the master component.

Figure 1:
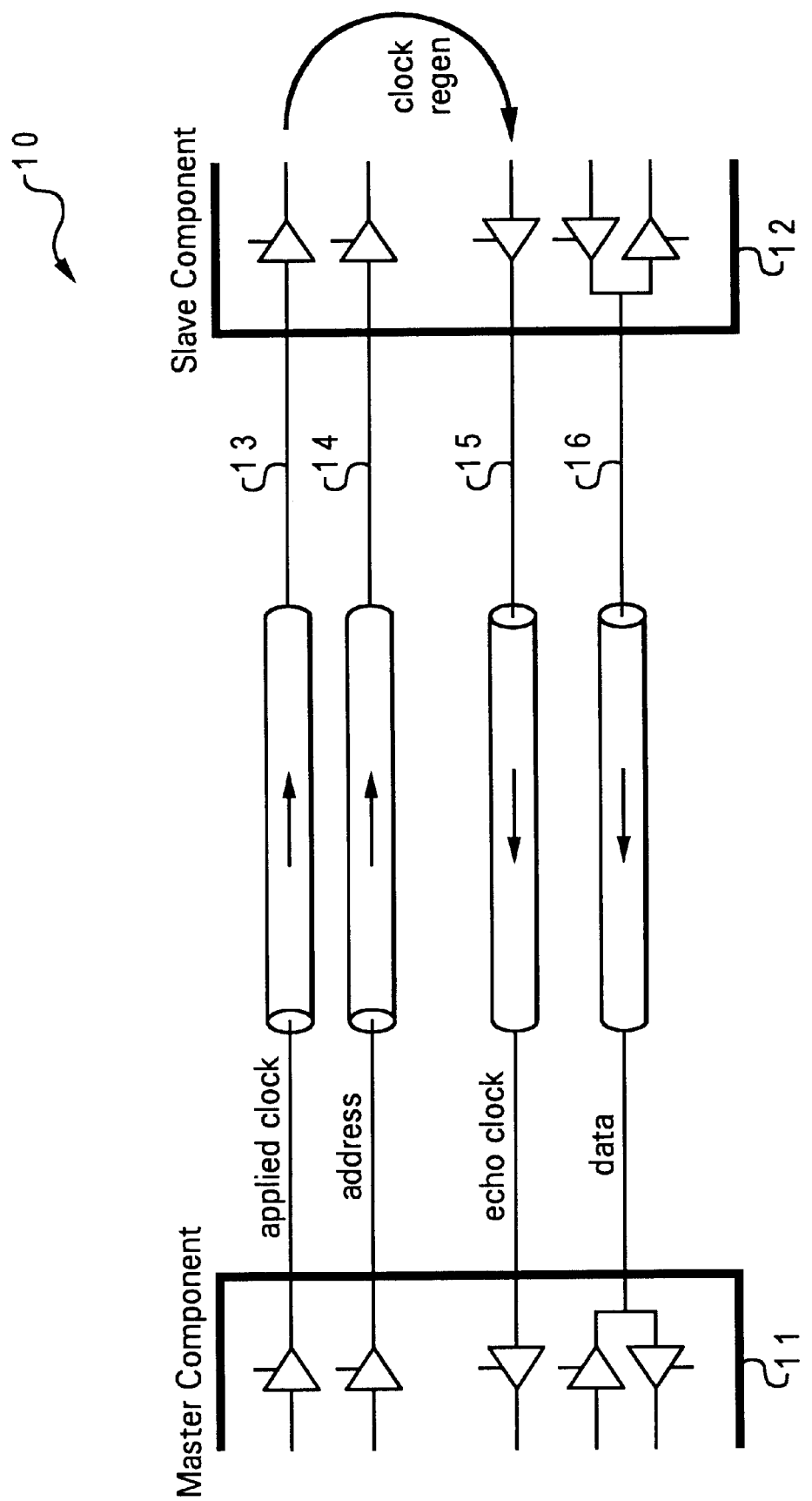
FIG. 1 is a block diagram of a source-synchronous communication interface in accordance with a preferred embodiment of the present invention.

Referring now to the drawings and, in particular, to FIG. 1, there is illustrated a block diagram of a source-synchronous communication interface in accordance with a preferred embodiment of the present invention. As shown, a source-synchronous communication interface 10 is provided between a master component 11, such as a processor, and a slave component 12, such as a cache memory. During operation, master component 11 sends a request, such as a request for data at a specific address, via an address bus 14 to slave component 12, timed according to a clock signal on an applied clock line 13. In response, slave component 12 sends a response, such as the requested data, via a data bus 16, timed according to a clock signal on an echo clock line 15.

Source-synchronous communication interface 10 requires a clock-transfer logic inside master component 11 to enable master component 11 to receive data from slave component 12. Typically, the clock-transfer logic uses an echo clock signal received from echo clock line 15 to sample the incoming data, and to make the incoming data available to the internal logic of master component 11 when the incoming data is guaranteed to be stable. However, this clock-transfer logic may be complicated by various system-dependent factors that can affect the delay between a request from master component 11 and a corresponding response returned from slave component 12. Sometimes, the delay is large enough that the latency for read data will necessarily be detained for one or two clock phases beyond any inherent delay. Furthermore, this latency can vary from one system to another, depending on the specific method of source-synchronous communication used to control the various sources of delay and skew.

Thus, when devising a software simulator to verify the logic that communicates across source-synchronous communication interface 10, it is very important for the software simulator to be able to accurately emulate various latency behavior of source-synchronous communication interface 10 under different operation scenarios. Furthermore, the verification mechanism of the software simulator has to be able to simulate all relevant scenarios in order to test the clock-transfer logic of source-synchronous communication interface 10. In addition, the verification mechanism should be simple and can reliably verify the functionality of source-synchronous communication interface 10.

In accordance with a preferred embodiment of the present invention, source-synchronous communication interface 10 is modelled in such a manner that a simulation of source-synchronous communication interface 10 is capable of increasing and decreasing the latency of data transferred across source-synchronous communication interface 10, within the limits of some specified minimum and maximum latency. The term "latency" refers to a delay in echo clock line 15 measured at the point of a rising clock edge, for example, with respect to a comparable point of a corresponding cycle of applied clock line 13. For a real device, this latency generally arises from two sources, namely, an inherent latency in slave component 12 and a latency related to variation in echo clock line 15 with respect to applied clock line 13.

The software simulator of the present invention is capable of handling pipelined operations, and it can simultaneously vary the delay between applied clock line 13 and echo clock line 15. This means that the response received from slave component 12 will sometimes be held longer than one applied clock cycle. However, regardless of what is happening in applied clock line 13, all response from data line 16 must be sent for at least one simulation tick per datum.

Figure 2:
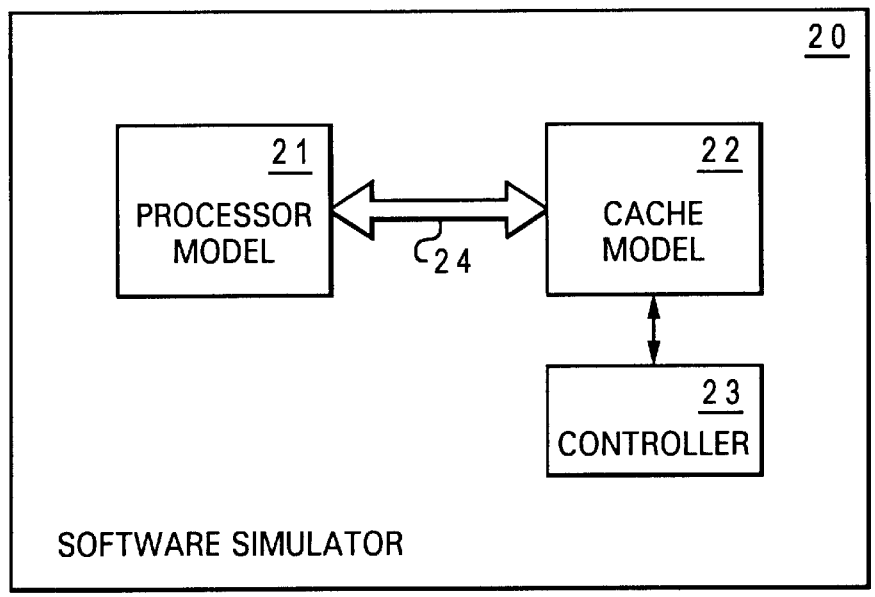
FIG. 2 is a high-level block diagram of a software simulator for verifying source-synchronous communication interface of a device, in accordance with a preferred embodiment of the present invention.

With reference now to FIG. 2, there is illustrated a high-level block diagram of a software simulator for verifying source-synchronous communication interface of a device, in accordance with a preferred embodiment of the present invention. As shown, a software simulator 20 includes a software model of a first device, such as a processor model 21, a software model of a second device, such as a cache model 22, and a software model of a controller 23 for controlling the timing of a source-synchronous communication interface 24 connected between processor model 21 and cache model 22.

Figure 3:
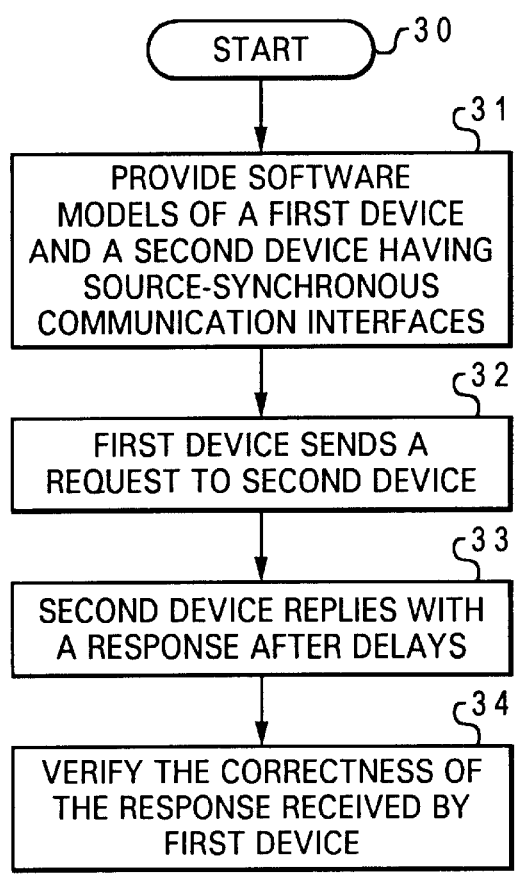
FIG. 3 is a high-level logic flow diagram of a method for verifying source-synchronous communication interface of a device, in accordance with a preferred embodiment of the present invention.

Referring now to FIG. 3, there is illustrated a high-level logic flow diagram of a method for verifying source-synchronous communication interface of a device, in accordance with a preferred embodiment of the present invention. Starting at block 30, a software model of a first device having a source-synchronous communication interface and a software model of a second device capable of communicating with the first device via the source-synchronous communication interface are first provided, as shown in block 31. The source-synchronous communication interface includes an applied clock line, an address line, an echo clock line, and a data line. Then, a request sent from the first device to the second device via the address line is simulated, as depicted in block 32. The second device responds to the request by sending a response to the first device via the data line after various delays between an applied clock signal and an echo clock signal on the applied clock line and the echo clock line, respectively, as illustrated in block 33. Those delays are controlled by the present invention. Finally, the response received by the first device is verified to determine whether or not it is correct, as shown in block 34.

A list of rules that governs the operations of software simulator 20 (from FIG. 2), which includes different delay variations between an applied clock and an echo clock, is as follows.

A. Rule 1

Figure 4:
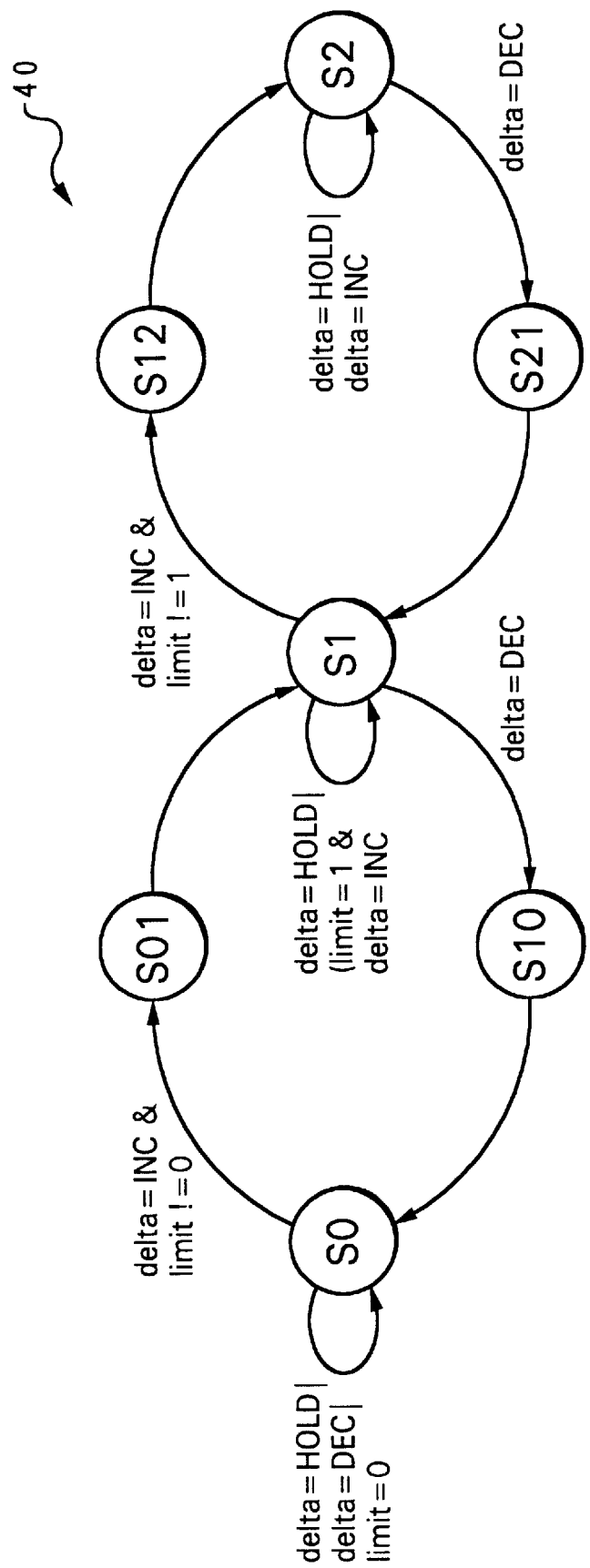
FIG. 4 is a state diagram of a state machine within the software simulator of FIG. 2, in accordance with a preferred embodiment of the present invention.

The delay between an edge of an applied clock and the corresponding edge of an echo clock is defined by a state machine. This state machine is preferably implemented within controller 23 of FIG. 2. With reference now to FIG. 4, there is illustrated a state diagram of a state machine 40 for defining various delays between an edge of an applied clock in an applied clock line and a corresponding edge in an echo clock in an echo clock line, in accordance with a preferred embodiment of the present invention. As shown, state machine 40 has a total of seven states, namely, state S0, state S1, state S2, state S01, state S12, state S10, and state S21. The definitions of the above-mentioned seven states are as follows:

S0—zero delay between applied clock and echo clock

S1—one applied clock phase delay between applied clock and echo clock

S2—two applied clock phases delay between applied clock and echo clock

S01—stretch echo clock from zero delay to one phase delay

S12—stretch echo clock from one phase delay to two phases delay

S10—shrink echo clock from one phase delay to zero delay

S21—shrink echo clock from two phases delay to one phase delay

The two inputs to state machine 40 are delta and limit. The delta input indicates whether the current clock delay should increase (INC), decrease (DEC), or remain the same (HOLD) in a subsequent echo clock cycle. A sequence of delta values can be coded for a simulation run in which the delta input can change from one transaction to another and is updated each time state machine 40 enters either state S0, state S1, or state S2. Alternatively, the sequence of delta values can be randomized for full verification. The limit input indicates the maximum delay that should ever be allowed between an applied clock on the applied clock line and an echo clock on the echo clock line. The limit input is used to simulate a situation when the worse-case delay is less than the maximum, and a reduced read latency is desired. The limit input is specified once at the beginning of simulation by a user, and can also be randomized for full verification.

B. Rule 2

State transitions in state machine 40 can only be taken when a timing signal ldcqmode_timing is asserted. This timing signal ldcqmode_timing is controlled by the software simulator of the present invention. The timing signal ldcqmode_timing guarantees that:

(1) states S0, S1, and S2 (the steady states) occupies exactly two applied clock phases before state machine 40 changes states;
(2) states S01 and S12 (the stretching states) occupies exactly three applied clock phases before state machine 40 changes states; and
(3) states S10 and S21 (the shrinking states) occupies exactly one applied clock phase before state machine 40 changes states.

A single clock cycle has two clock phases, one high clock phase and one low clock phase.

Figure 5:
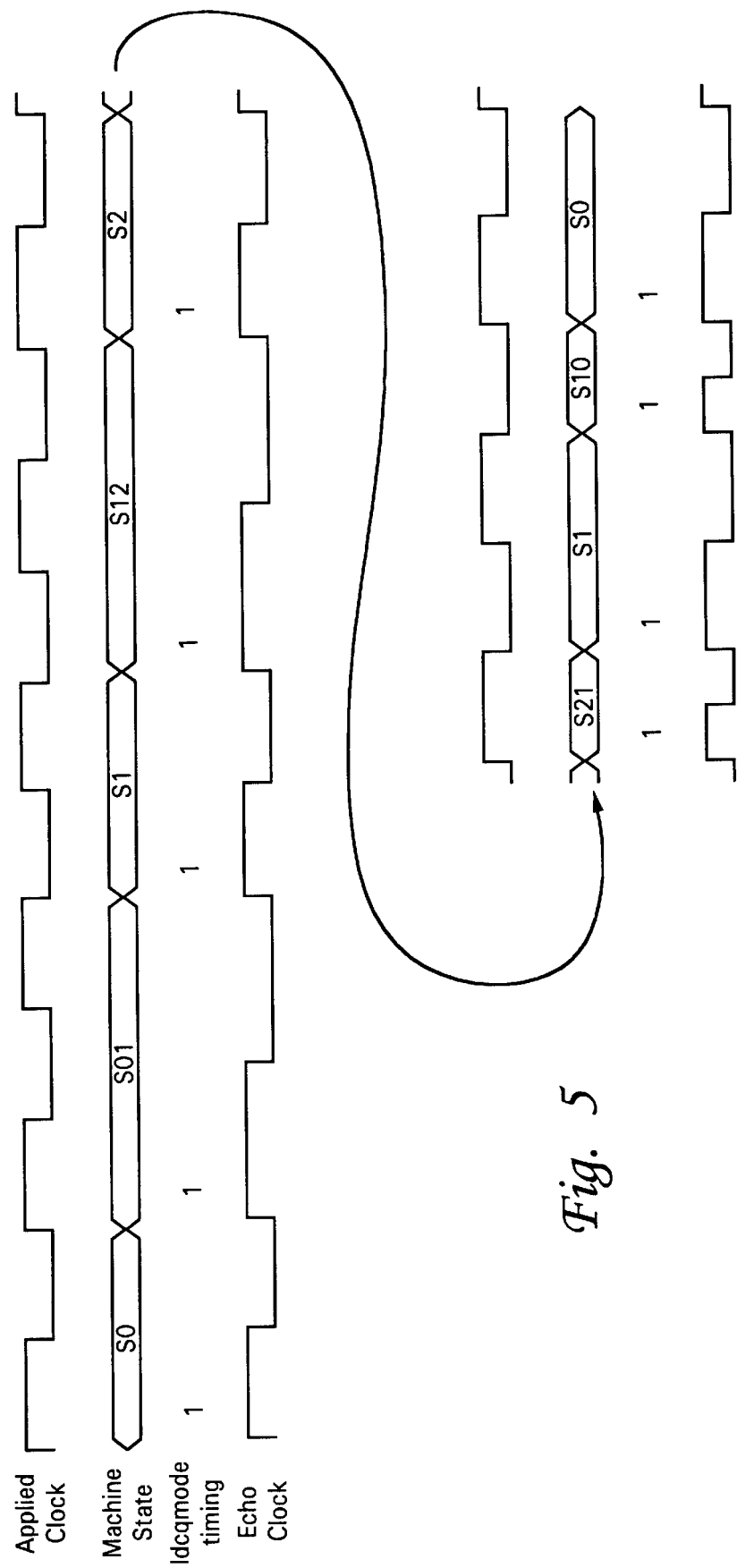
FIG. 5 is an example of different states of the state machine from FIG. 4 with respective to a timing signal, in accordance with a preferred embodiment of the present invention.

Referring now to FIG. 5, there is illustrated an example of different states of state machine 40 with respect to timing signal ldcqmode_timing, in accordance with a preferred embodiment of the present invention. As shown, for steady states S0, S1, and S2, exactly one applied clock cycle is generated between ldcqmode_timing pulses. Also, the transitional states (i.e., stretching states S01 and S12 and shrinking states S10 and S21) serve as spacers between the steady states in order to make the echo clock match up with the appropriate delay of the applied clock.

Furthermore, the applied clock event that triggers an assertion of timing signal ldcqmode_timing for one simulation tick includes:

| machine states | simulation tick for asserting ldcgmode_timing |
|---|---|
| S0 | rising edge (i.e., beginning of a high clock) |
| S1 | falling edge (i.e., beginning of a low clock) |
| S2 | rising edge |
| S01 | second falling edge since entering this state |
| S12 | second rising edge since entering this state |
| S10 | rising edge |
| S21 | falling edge |

All edges are reference to the applied clock.

C. Rule 3

To ensure any logic bug associated with an initial condition is detectable, the initial state of state machine 40 is configurable by the user. The initial state could be a constant specified by the user or randomized for full verification. Any one of the steady states S0, S1, and S2 can be a legal initial state for state machine 40.

D. Rule 4

The echo clock on the echo clock line should be generated based on the knowledge of the current delay state. There are three separate subrules for generating echo clocks in three separate categories of delay states.

i. Rule 4a

Steady states S0, S1, and S2 represent a fixed delay between an applied clock and an echo clock. In these cases, two applied clock phases correspond to each echo clock cycle (see FIG. 5). Since the number of cycle-based simulation ticks in each applied clock phase is known, the echo clock can be generated for these states by, for example, shifting the values of the applied clock into a shift register for every tick. The echo clock is then generated by sampling the entries within the shift register that correspond to the desired number of ticks delay to accomplish the desired number of clock delay.

ii. Rule 4b

Clock stretching states S01 and S12 represent an increase in delay between an applied clock and an echo clock. In these cases, three applied clock phases correspond to each echo clock cycle (see FIG. 5). As a result, the latency increases by one clock phase at the applied clock. To accomplish this, an echo clock pattern is generated with a width of three applied clock phases such that the echo clock is high at the first tick, and the echo clock is low at the last tick. During simulation, ticks occur between the first and the last of the three applied clock phases, the echo clock must descend exactly once, and not rise again. The tick when the echo clock falls can be configured using a stretch1 parameter, which can be controlled or randomized by the user. Stretch1 specifies how many ticks the echo clock should be high when generating a clock pattern to fill the stretch1 window. Valid values for stretch1 range between one tick at a minimum to ensure the echo clock cycle contains at least one tick high, and three times the applied clock phases minus one, to ensure the echo clock cycle contains at least one tick low.

State S01 must also observe a special case. It is undesirable to generate a falling edge of the echo clock prior to the corresponding falling edge of the applied clock. Because the generated clock pattern in a clock stretching state is somewhat independent of the applied clock pattern during the same time, special care needs to be taken to avoid such a non-casual scenario that might rightly confuse the processor logic on which verification is being performed. This is accomplished by modifying the stretch1 parameter supplied by the user if it is less than one applied clock phase, in delay state S01 only.

iii. Rule 4c

Clock shrinking states S10 and S21 represent a decrease in delay between an applied clock and an echo clock. In these cases, one applied clock phase corresponds to each echo clock cycle (see FIG. 5). As a result, the latency decreases by one clock phase at the applied clock. To accomplish this, an echo clock pattern is generated with a width of one applied clock phase, such that during the first tick echo clock is high, and during the last tick echo clock is low. During simulation ticks between the first and last of this one phase window, the echo clock must descend exactly once, and not rise again. The tick when the echo clock falls can be configured using the stretch1 parameter mentioned above, which can be controlled or randomized by the user. In the case of clock shrinking states, valid values for stretch1 range between one tick at a minimum, and the number of ticks in an applied clock phase less one, to ensure the echo clock cycle contains at least one tick high and one tick low.

Clock shrinking states have one special case that does not exist in clock stretching states. Since values for both types of states come from the stretch1 parameter, and some stretch1 values are legal for clock stretching states but illegal for clock shrinking states, the current value of stretch1 must sometimes be internally modified. For example, during a clock shrinking state, if the current value of stretch1 is greater than or equal to the number of ticks in an applied clock phase, stretch1 will reduced until stretch1 becomes a legal value for a clock shrinking state.

In generating this echo clock pattern, with a width of one applied clock phase, the echo clock falls in response to a selected simulation tick, wherein the selection depends on the parameter stretch1. For this pattern, valid values for stretch1 range between a minimum of one simulation tick to ensure the echo clock is high for at least one simulation tick, and a maximum of simulation ticks numbering N−1 to ensure the echo clock is low for at least one simulation tick low, where N is number of ticks in an applied clock phase.

E. Rule 5

Figure 6:
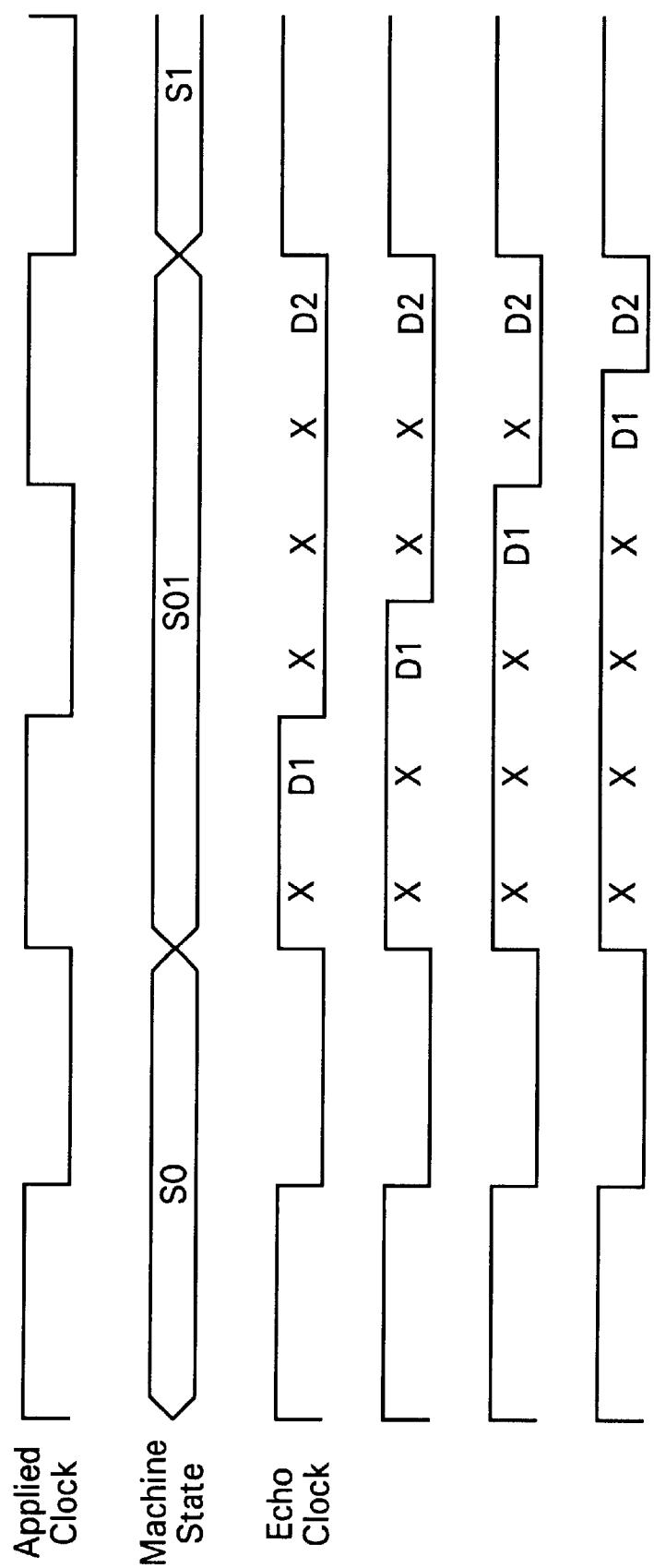
FIG. 6 is a timing diagram of four different instances of echo clock patterns with data returning in each phase, in accordance with a preferred embodiment of the present invention.

In order to ensure that the logic under test only samples data values when they should be sampled, incorrect data is provided to the slave component during all simulation ticks that do not immediately proceed the rising and falling edges of the echo clock. As shown in FIG. 6, four different instances of echo clock patterns when N=2 are illustrated, where N is number of ticks in an applied clock phase. In FIG. 6, D1 is the first datum, D2 is the second datum, and X is the bad datum. The rising and falling edges of the echo clock are anticipated as follows. State machine 40 has prior knowledge of the future value of the echo clock, and therefore knows for certain whether or not this is the required data to sample. Thus, only the correct data should be returned at the sample ticks.

The software simulator of the present invention may be implemented in a variety of computers under a number of different operating systems. The computer may be, for example, a personal computer, a mid-range or a mainframe computer. In addition, the computer may be a stand-alone system or part of a network such as a local-area network (LAN) or a wide-area network (WAN). For the purpose of illustration, a preferred embodiment of the present invention, as described below, is implemented on a mid-range computer, such as the RS/6000™ series manufactured by International Business Machines Corporation of Armonk, New York.

Referring now to FIG. 7, there is illustrated a block diagram of a computer system that may be utilized by a preferred embodiment of the invention. Within computer box 70, main processor 21 is coupled to a main memory 72 and a multiple function I/O processor (MFIOP) 74. Main processor 71 may include a single processor or multiple processors. Several peripheral storage devices such as diskette drive 76, tape drive 77, and direct access storage devices (DASDs) 78, are controlled by MFIOP 74. In addition, MFIOP 74 provides communications to other devices via communication ports such as COMM 1 and COMM 2.

Attached to system bus 79 are a workstation controller 73 and a communications I/O processor (CIOP) 75. Workstation controller 73 provides communications between main processor 71 and workstation(s) 90 that may be connected to the computer system. CIOP 75 provides communications to other devices via communication ports such as COMM3, COMM4, and COMM5.

As has been described, the present invention provides an improved method for verifying source-synchronous communications interface of a device, such as a processor.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for verifying a source-synchronous communication interface of a device, said method comprising the steps of:

providing a software model of a first device having a source-synchronous communication interface, wherein said source-synchronous communication interface includes an applied clock line, a request line, an echo clock line, and a response line;

providing a software model of a second device capable of communicating with said first device via said source-synchronous communication interface;

simulating a sending of a request from said first device model to said second device model via said request line along with an applied clock signal on said applied clock line;

receiving a response from said second device model to said first device model via said data line after various delays between said applied clock signal on said applied clock line and an echo clock signal on said echo clock line; and verifying whether or not said response received by said first device model is correct.

2. The method according to claim 1, wherein said receiving step further includes a step of receiving a response from said second device model to said first device model via said data line after zero phase delay between said applied clock signal and an echo clock signal.

3. The method according to claim 1, wherein said receiving step further includes a step of receiving a response from said second device model to said first device model via said data line after one phase delay between said applied clock signal and an echo clock signal.

4. The method according to claim 1, wherein said receiving step further includes a step of receiving a response from said second device model to said first device model via said data line after two phases delay between said applied clock signal and an echo clock signal.

5. A computer system for verifying a source-synchronous communication interface of a device, comprising:

means for providing a software model of a first device having a source-synchronous communication interface, wherein said source-synchronous communication interface includes an applied clock line, a request line, an echo clock line, and a response line;

means for providing a software model of a second device model capable of communicating with said first device model via said source-synchronous communication interface;

means for simulating a sending of a request from said first device model to said second device model via said request line along with an applied clock signal on said applied clock line;

means for receiving a response from said second device model to said first device model via said data line after various delays between said applied clock signal on said applied clock line and an echo clock signal on said echo clock line; and means for verifying whether or not said response received by said first device model is correct.

6. The computer system according to claim 5, wherein said receiving means further includes a means for receiving a response from said second device model to said first device model via said data line after zero phase delay between said applied clock signal and an echo clock signal.

7. The computer system according to claim 5, wherein said receiving means further includes a means for receiving a response from said second device model to said first device model via said data line after one phase delay between said applied clock signal and an echo clock signal.

8. The computer system according to claim 5, wherein said receiving means further includes a means for receiving a response from said second device model to said first device model via said data line after two phases delay between said applied clock signal and an echo clock signal.

9. A computer program product residing on a computer usable medium for verifying a source-synchronous communication interface of a device, said computer program product comprising:

program code means for providing a software model of a first device having a source-synchronous communication interface, wherein said source-synchronous communication interface includes an applied clock line, a request line, an echo clock line, and a response line;

program code means for providing a software model of a second device model capable of communicating with said first device model via said source-synchronous communication interface;

program code means for simulating a sending of a request from said first device model to said second device model via said request line along with an applied clock signal on said applied clock line;

program code means for receiving a response from said second device model to said first device model via said data line after various delays between said applied clock signal on said applied clock line and an echo clock signal on said echo clock line; and program code means for verifying whether or not said response received by said first device model is correct.

10. The computer program product according to claim 9, wherein said program code means for receiving further includes a program code means for receiving a response from said second device model to said first device model via said data line after zero phase delay between said applied clock signal and an echo clock signal.

11. The computer program product according to claim 9, wherein said program code means for receiving further includes a program code means for receiving a response from said second device model to said first device model via said data line after one phase delay between said applied clock signal and an echo clock signal.

12. The computer program product according to claim 9, wherein said program code means for receiving further includes a program code means for receiving a response from said second device model to said first device model via said data line after two phases delay between said applied clock signal and an echo clock signal.

* * * * *